(12) United States Patent
Haratsch et al.

(10) Patent No.: US 8,788,923 B2
(45) Date of Patent: Jul. 22, 2014

(54) METHODS AND APPARATUS FOR SOFT DEMAPPING AND INTERCELL INTERFERENCE MITIGATION IN FLASH MEMORIES

(75) Inventors: Erich F. Haratsch, Bethlehem, PA (US); Milos Ivkovic, Sunnyvale, CA (US); Victor Krachkovsky, Allentown, PA (US); Nenad Miladinovic, Campbell, CA (US); Andrei Vityaev, San Jose, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 386 days.

(21) Appl. No.: 13/001,317

(22) PCT Filed: Jun. 30, 2009

(86) PCT No.: PCT/US2009/049333
§ 371 (c)(1),
(2), (4) Date: Feb. 25, 2011

(87) PCT Pub. No.: WO2010/002948
PCT Pub. Date: Jan. 7, 2010

(65) Prior Publication Data
US 2011/0145487 A1   Jun. 16, 2011

Related U.S. Application Data

(60) Provisional application No. 61/133,675, filed on Jul. 1, 2008, provisional application No. 61/133,921, filed on Jul. 7, 2008, provisional application No. 61/134,688, filed on Jul. 10, 2008, provisional application No. 61/135,732, filed on Jul. 22, 2008, provisional application No. 61/194,751, filed on Sep. 30, 2008.

(51) Int. Cl.
*G06F 11/00* (2006.01)
*H03M 13/00* (2006.01)
*G11C 16/34* (2006.01)
*G11C 5/00* (2006.01)
*G06F 11/10* (2006.01)

(52) U.S. Cl.
CPC .............. *G11C 16/3427* (2013.01); *G11C 5/00* (2013.01); *G06F 11/1072* (2013.01)
USPC ........................................................ 714/810

(58) Field of Classification Search
CPC ... G11C 16/3427; G11C 5/00; G06F 11/1072
USPC .......................... 714/794, 746, 773–774, 810
See application file for complete search history.

(56) References Cited

U.S. PATENT DOCUMENTS 6,980,140 B1 * 12/2005 Rowland et al. .............. 341/118
2007/0189073 A1    8/2007 Aritome
(Continued)

FOREIGN PATENT DOCUMENTS

WO   WO 2007/132453   11/2007
WO   WO 2007/132457   11/2007
(Continued)

*Primary Examiner* — Shelly A Chase
(74) *Attorney, Agent, or Firm* — Ryan, Mason & Lewis, LLP

(57) ABSTRACT

Methods and apparatus are provided for soft demapping and intercell interference mitigation in flash memories. In one variation, a target cell in a flash memory device capable of storing at least two data levels, s, per cell is read by obtaining a measured read value, r, for at least one target cell in the flash memory; obtaining a value, h, representing data stored for at least one aggressor cell in the flash memory; selecting one or more probability density functions based on a pattern of values stored in at least a portion of the flash memory, wherein the probability density functions comprises pattern-dependent disturbance of one or more aggressor cells on the at least one target cell in the flash memory; evaluating at least one selected probability density function based on the measured read value, r; and computing one or more log likelihood ratios based on a result of the evaluating step.

33 Claims, 12 Drawing Sheets

(56) References Cited

U.S. PATENT DOCUMENTS

2008/0019188 A1 1/2008 Li
2008/0151617 A1 6/2008 Alrod et al.
2009/0319868 A1* 12/2009 Sharon et al. ................ 714/763

FOREIGN PATENT DOCUMENTS

| WO | WO 2007/149678 | 12/2007 |
| WO | WO 2008/042593 | 4/2008 |
| WO | WO 2008/042598 | 4/2008 |

* cited by examiner

METHODS AND APPARATUS FOR SOFT DEMAPPING AND INTERCELL INTERFERENCE MITIGATION IN FLASH MEMORIES

CROSS-REFERENCE TO RELATED APPLICATIONS

The present application claims priority to United States Provisional Patent Application Ser. No. 61/133,675, filed Jul. 1, 2008; U.S. Provisional Patent Application Ser. No. 61/133,921, filed Jul. 3, 2008; U.S. Provisional Patent Application Ser. No. 61/134,688, filed Jul. 10, 2008; U.S. Provisional Patent Application Ser. No. 61/135,732, filed Jul. 22, 2008; and U.S. Provisional Patent Application Ser. No. 61/194,751, filed Sep. 30, 2008, each incorporated by reference herein.

The present application is related to International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," and International patent application Ser. No. 13/001,278, entitled "Methods and Apparatus for Read-Side Intercell Interference Mitigation in Flash Memories;" International patent application Ser. No. 13/001,286, entitled "Methods and Apparatus for Write-Side Intercell Interference Mitigation in Flash Memories;" International patent application Ser. No. 13/001,300, entitled "Methods and Apparatus for Interfacing Between a Flash Memory Controller and a Flash Memory Array;" and International patent application Ser. No. 13/001,310, entitled "Methods and Apparatus for Intercell Interference Mitigation Using Modulation Coding," each filed contemporaneously herewith and incorporated by reference herein.

FIELD OF THE INVENTION

The present invention relates generally to flash memory devices and more particularly, to improved demapping techniques and improved techniques for mitigating the effect of intercell interference, back pattern dependency, noise and other distortions in such flash memory devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding," incorporated by reference herein.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

ICI is a consequence of parasitic capacitances between cells and is generally considered to be the most prominent source of distortion. Id. For example, ICI is known to increase with technology scaling and becomes a significant source of distortion of the threshold voltage distribution as transistor sizes become smaller. Thus, ICI is of particular concern for reliable MLC memories, as ICI limits the number of voltage levels that can reliably be stored in the MLC memory.

A number of techniques have been proposed or suggested for mitigating the effect of ICI by reducing the capacitive coupling between cells. For example, Ki-Tae Park, et al. describe existing programming techniques, such as even/odd programming, bottom up programming and multi-stage programming that mitigate ICI. While these existing methods have helped to reduce the effect of ICI, they become less effective as transistor sizes are reduced, for example, below 65 nm technologies, where parasitic capacitances are much larger due to the close proximity of flash cells. A need therefore exists for improved signal processing and coding techniques for mitigating the effect of ICI, noise, BPD and other distortions.

SUMMARY OF THE INVENTION

Generally, methods and apparatus are provided for soft demapping and intercell interference mitigation in flash memories. According to one aspect of the invention, a target cell in a flash memory device capable of storing at least two data levels, s, per cell is read by obtaining a measured read value, r, for at least one target cell in the flash memory; evaluating at least one probability density function based on the measured read value, r, wherein the probability density function indicates a probability of measuring a read value, r, for a given data level, s; and computing one or more log likelihood ratios based on a result of the evaluating step.

The probability density function may further comprise an expression of disturbance on the target cell, such as pattern-dependent disturbance of one or more aggressor cells on at least one target cell in the flash memory. The disturbance may comprise, for example, back pattern dependency, intercell interference, program disturb, read disturb and/or additional noise. The probability density function can be represented as a stored table and/or an expression. For example, the probability density functions can be based on one or more of a histogram, a Gaussian approximation or another approximation. A trellis-based detection algorithm can detect the data based on knowledge of the probability density function.

Generally, the computing step further comprises the step of aggregating for each of two possible binary values the probability of measuring a read value, r, for a given data level, s, for all data levels associated with the two possible binary values. The aggregating comprises, for example, a sum and/or a multiplication. In addition, a ratio may be formed based on the aggregated probabilities for each of the two possible binary values. The aggregated probabilities for each of the two possible binary values can be multiplied by an expression based on one or more a priori probability values for all bits within a cell other than a bit for which the log likelihood ratio is being computed.

According to one aspect of the invention, a target cell in a flash memory device capable of storing at least two data levels, s, per cell is read by obtaining a measured read value, r, for at least one target cell in the flash memory; obtaining a value, h, representing data stored for at least one aggressor cell in the flash memory; selecting one or more probability density functions based on a pattern of values stored in at least a portion of the flash memory, wherein the probability density functions comprises pattern-dependent disturbance of one or more aggressor cells on the at least one target cell in the flash memory; evaluating at least one selected probability density function based on the measured read value, r; and computing one or more log likelihood ratios based on a result of the evaluating step. The values, h, may be hard decision and/or soft values or detected data. The computed log likelihood ratios can optionally be employed in an iterative manner.

Generally, the evaluating step determines a pattern-dependent probability of measuring a read value, r, for a given data level, s, for a given pattern of values stored in the one or more aggressor cells.

According to one aspect of the invention, disturbance in a flash memory device is characterized by obtaining one or more probability density functions that express pattern-dependent disturbance of one or more aggressor cells on at least one target cell; and selecting one or more of the probability density functions based on a pattern of values stored in at least a portion of the flash memory. The disturbance may comprise, for example, back pattern dependency, intercell interference, program disturb, read disturb and/or additional noise. The probability density function can be updated based on one or more data decisions.

The table entries or function parameters of the probability density functions may optionally be adaptively updated, e.g., based on received data decisions. For example, a probability density function can be selected based on a received aggressor pattern, h. Thereafter, the selected probability density function is updated (e.g., by increasing a corresponding counter) with the latest occurrence, based on the received target cell value, r, using known techniques.

A more complete understanding of the present invention, as well as further features and advantages of the present invention, will be obtained by reference to the following detailed description and drawings.

DETAILED DESCRIPTION

Various aspects of the present invention are directed to signal processing techniques for mitigating ICI in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Figure 1:
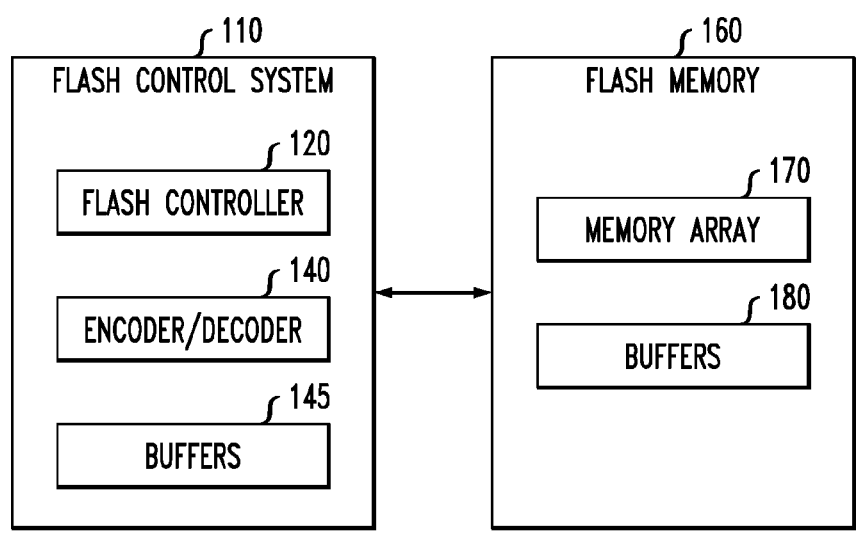
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
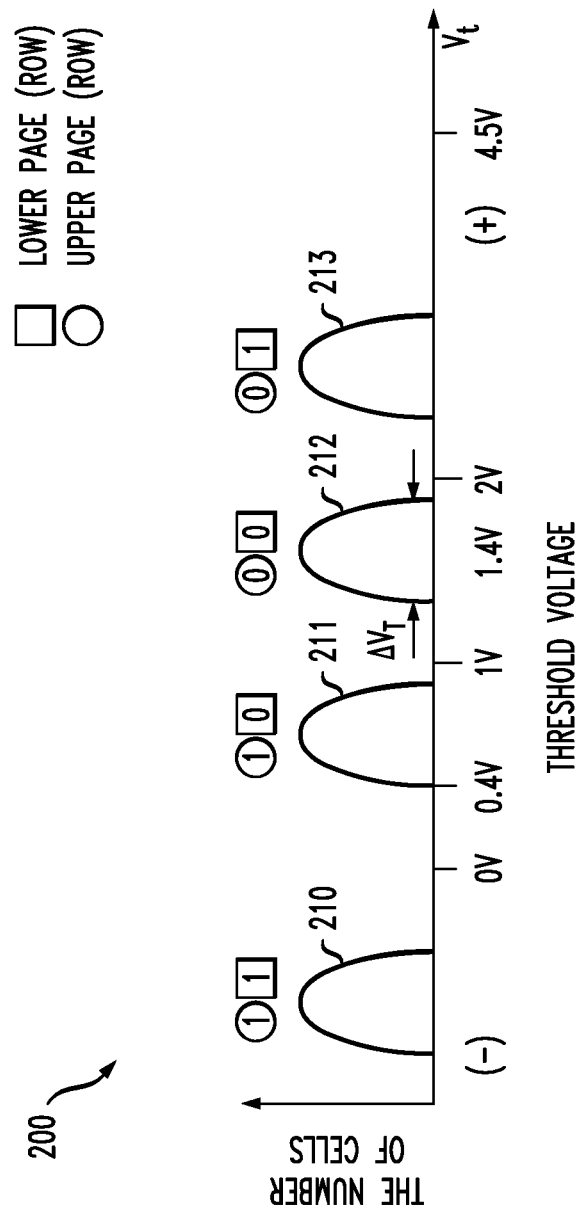
FIG. 2 illustrates an exemplary threshold voltage distribution for the exemplary multi-level cell flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
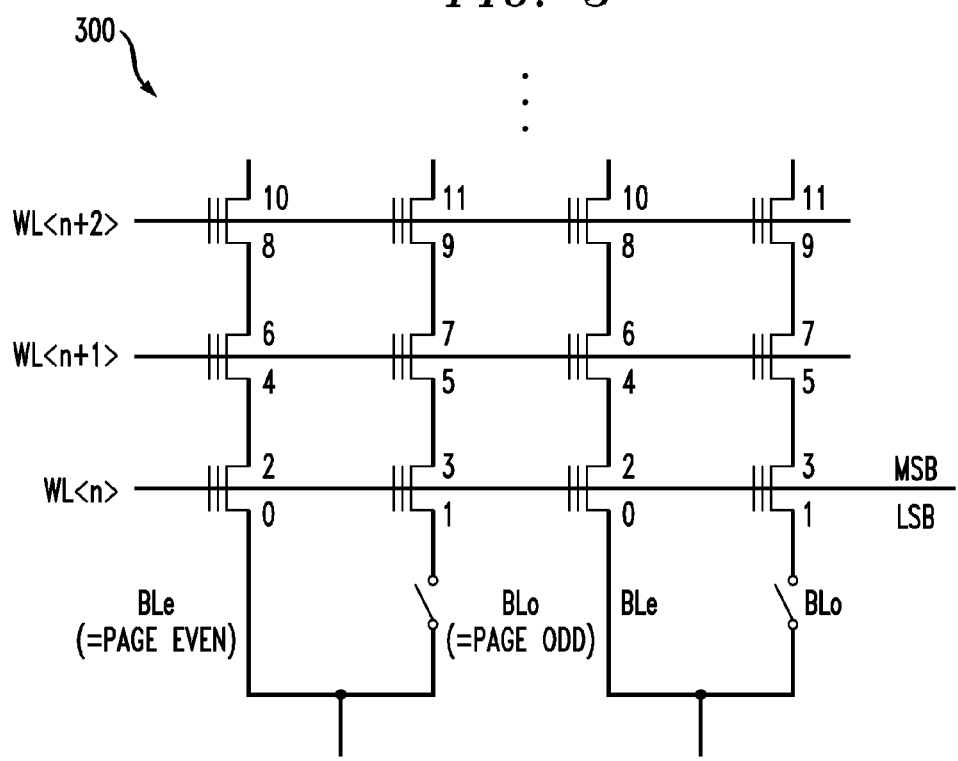
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
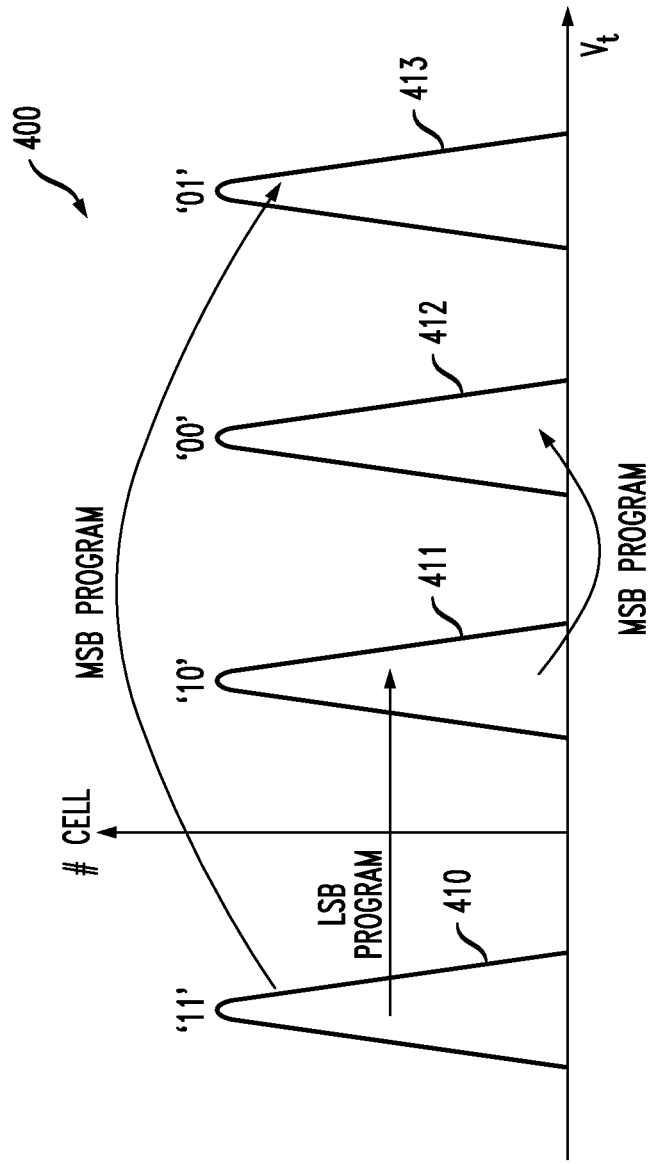
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

Figure 5A:
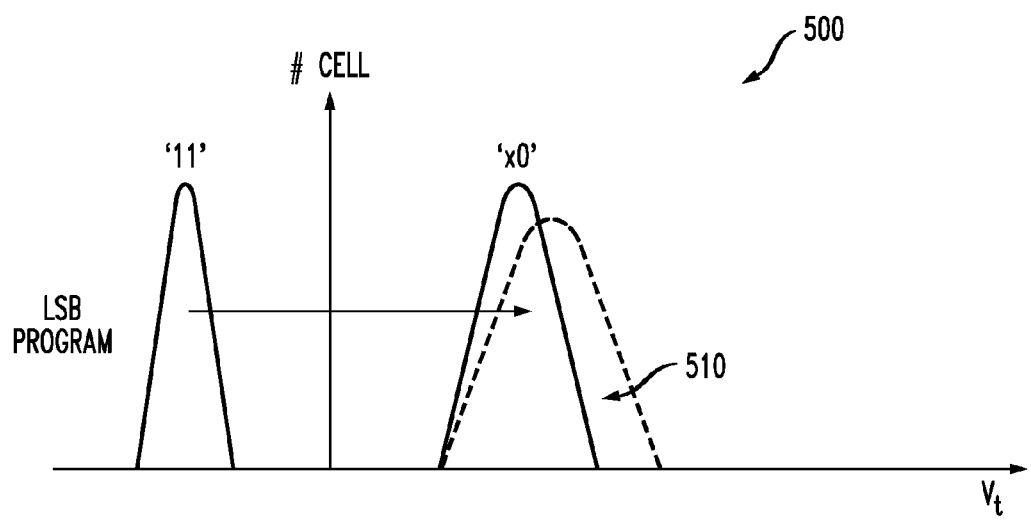
FIGS. 5A and 5B, collectively, illustrate an alternative MLC programming scheme that reduces the ICI inflicted on neighboring cells.
Figure 5B:
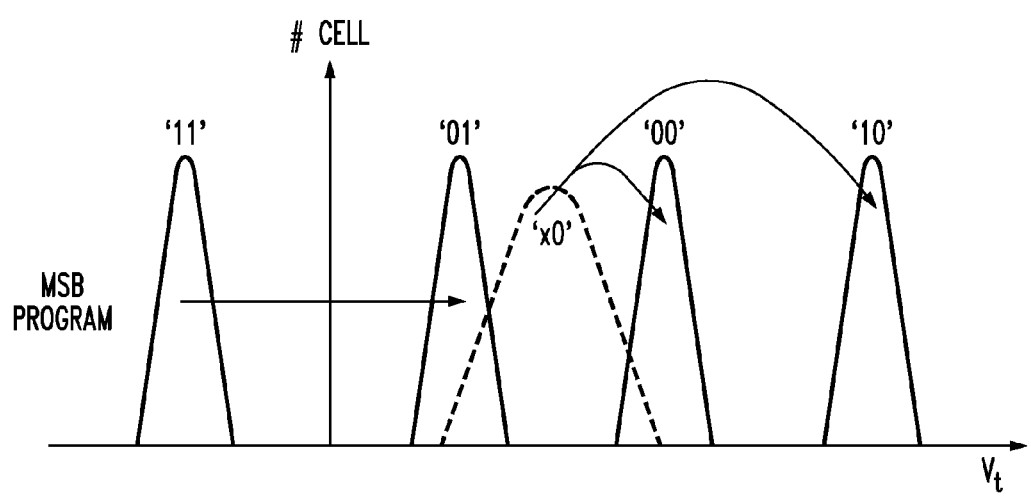

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can be seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
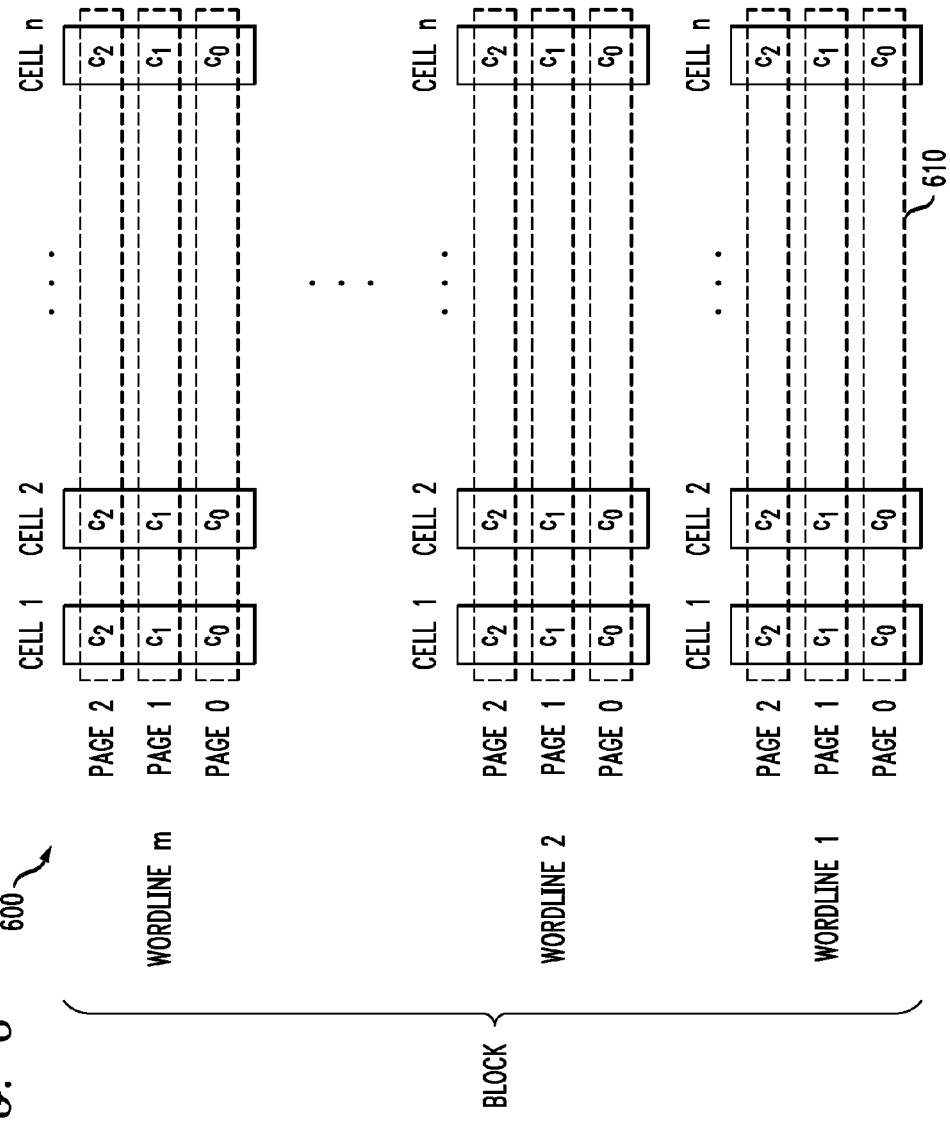
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell, $c_i$. FIG. 6 illustrates the flash cell array architecture for one block, where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference

Figure 7:
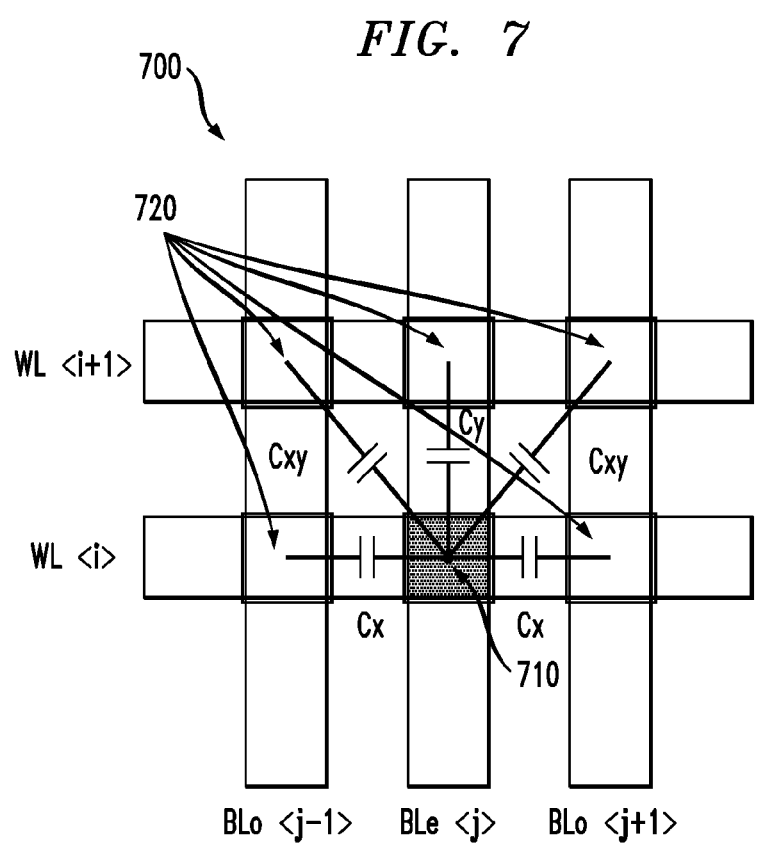
FIG. 7 illustrates the ICI that is present for a target cell due to the parasitic capacitance from a number of exemplary aggressor cells.

As previously indicated, ICI is a consequence of parasitic capacitances between cells and is generally considered to be one of the most prominent sources of distortion. FIG. 7 illustrates the ICI that is present for a target cell 710 due to the parasitic capacitance from a number of exemplary aggressor cells 720. The following notations are employed in FIG. 7:

WL: wordline;
BL: bitline;
BLo: odd bitline;
BLe: even bitline; and
C: capacitance.

The present invention recognizes that ICI is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

The ICI caused by the aggressor cells 720 on the target cell 710 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x$, $k_y$, and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

Demapping and ICI Mitigation

The present invention provides an improved demapping function for flash memories, using probability density functions. As used herein, the term "probability density functions" shall include probability density functions and approximations thereof, such as histograms and Gaussian approximations. According to one aspect of the present invention, discussed below in conjunction with FIGS. 12-13, the disclosed ICI mitigation functionality is optionally implemented with the demapping function, to provide a joint demapping and ICI mitigation solution. In a further variation, discussed below in conjunction with FIG. 10, an iterative demapping and decoding technique using one or more probability density functions is described to read and detect data from a flash memory. In a further variation, as discussed hereinafter, the disclosed demapping solutions consider probability density functions (pdfs) that are dependent on the data patterns stored in neighbouring cells instead of pdfs that do not have this data dependency. In one exemplary embodiment, each probability density function characterizes pattern-dependent disturbance of one or more aggressor cells on at least one target cell in the flash memory array.

In one exemplary implementation, a joint demapping and ICI mitigation solution assumes that the probability density functions can be approximated using Gaussian probability density functions. Additional higher complexity implementations are discussed based on histograms. Also, trellis-based detection algorithms that detect read data based on the probability density functions or approximations thereof are described, such as Viterbi, Soft Output Viterbi (SOVA) and BCJR algorithms that, in principle, provide better performance at the expense of higher complexity.

Figure 8:
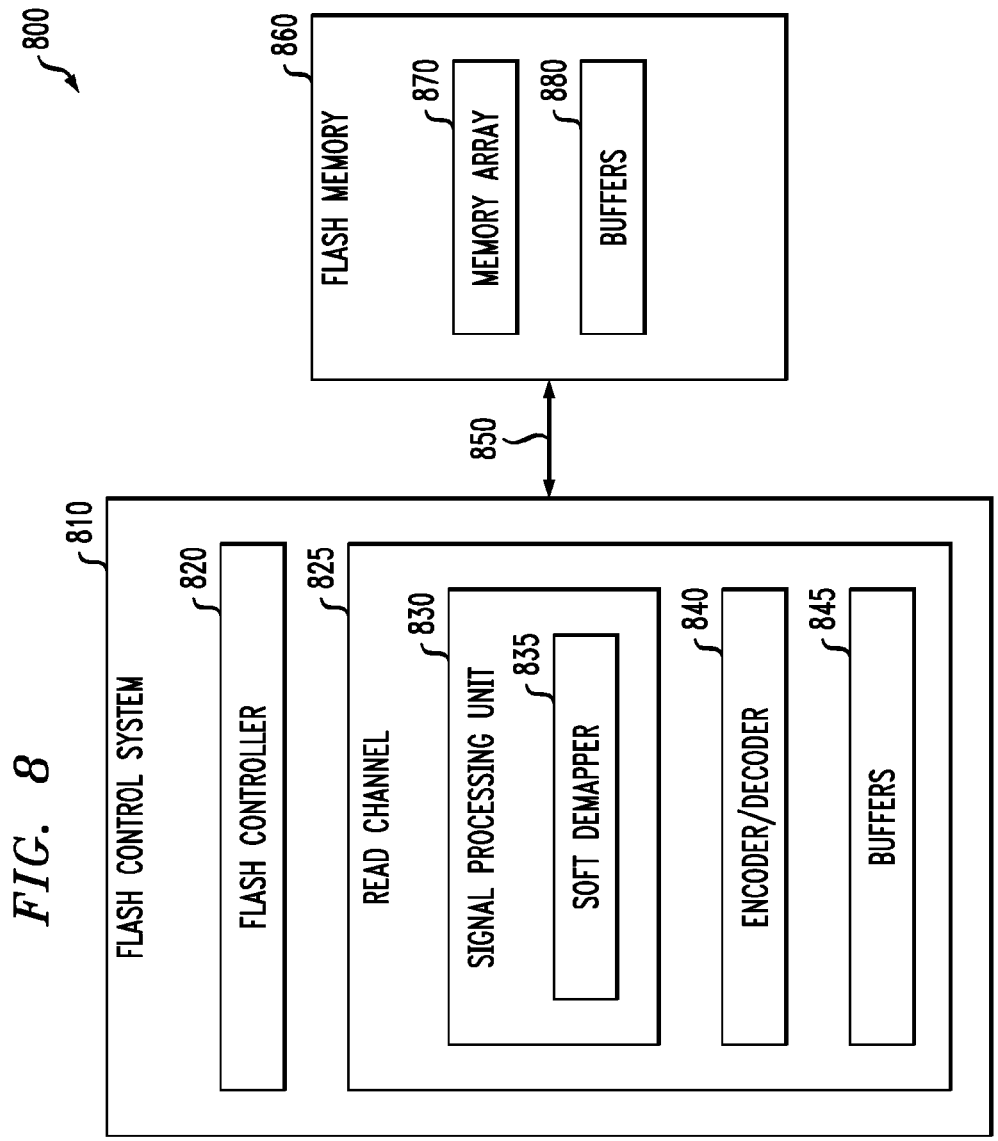
FIG. 8 is a schematic block diagram of an exemplary flash memory system incorporating controller-based ICI mitigation techniques in accordance with the present invention.

FIG. 8 is a schematic block diagram of an exemplary flash memory system 800 incorporating controller-based soft demapper techniques in accordance with the present invention. In a further embodiment, flash memory system 800 incorporates controller-based joint demapping and ICI mitigation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more soft demapping processes 835, discussed further below in conjunction with, for example, FIGS. 10-11. In a further embodiment, the soft demapper 835 implements one or more joint demapping and ICI mitigation processes, discussed further below in conjunction with, for example, FIGS. 12-13. The exemplary flash memory block 860 comprises a memory array 870 and one or more buffers 880 that may each be implemented using well-known commercially available techniques and/or products.

In various embodiments of the disclosed ICI mitigation techniques, the exemplary interface 850 may need to convey additional information relative to a conventional flash memory system, such as values representing information associated with aggressor cells. Thus, the interface 850 may need to have a higher capacity or faster rate than an interface in conventional flash memory systems. The interface 850 may optionally be implemented, for example, in accordance with the teachings of International PCT Patent Application Serial No. PCT/US09/49328, entitled "Methods and Apparatus for Interfacing Between a Flash Memory Controller and a Flash Memory Array", filed contemporaneously herewith and incorporated by reference herein, which increases the information-carrying capacity of the interface 850 using, for example, Double Data Rate (DDR) techniques.

During a write operation, the interface 850 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 850 transfers hard and/or soft read values that have been obtained from the memory array 870 for target and aggressor cells. For example, in addition to read values for the page with the target cell, read values for one or more adjacent pages in upper/lower wordlines or neighboring even or odd bit lines are transferred over the interface bus. In the embodiment of FIG. 8, the disclosed ICI mitigation techniques are implemented outside the flash memory, typically in a process technology optimized for logic circuits to achieve the lowest area. It is at the expense, however, of the additional aggressor cell data that must be transferred on the interface 850.

Figure 9:
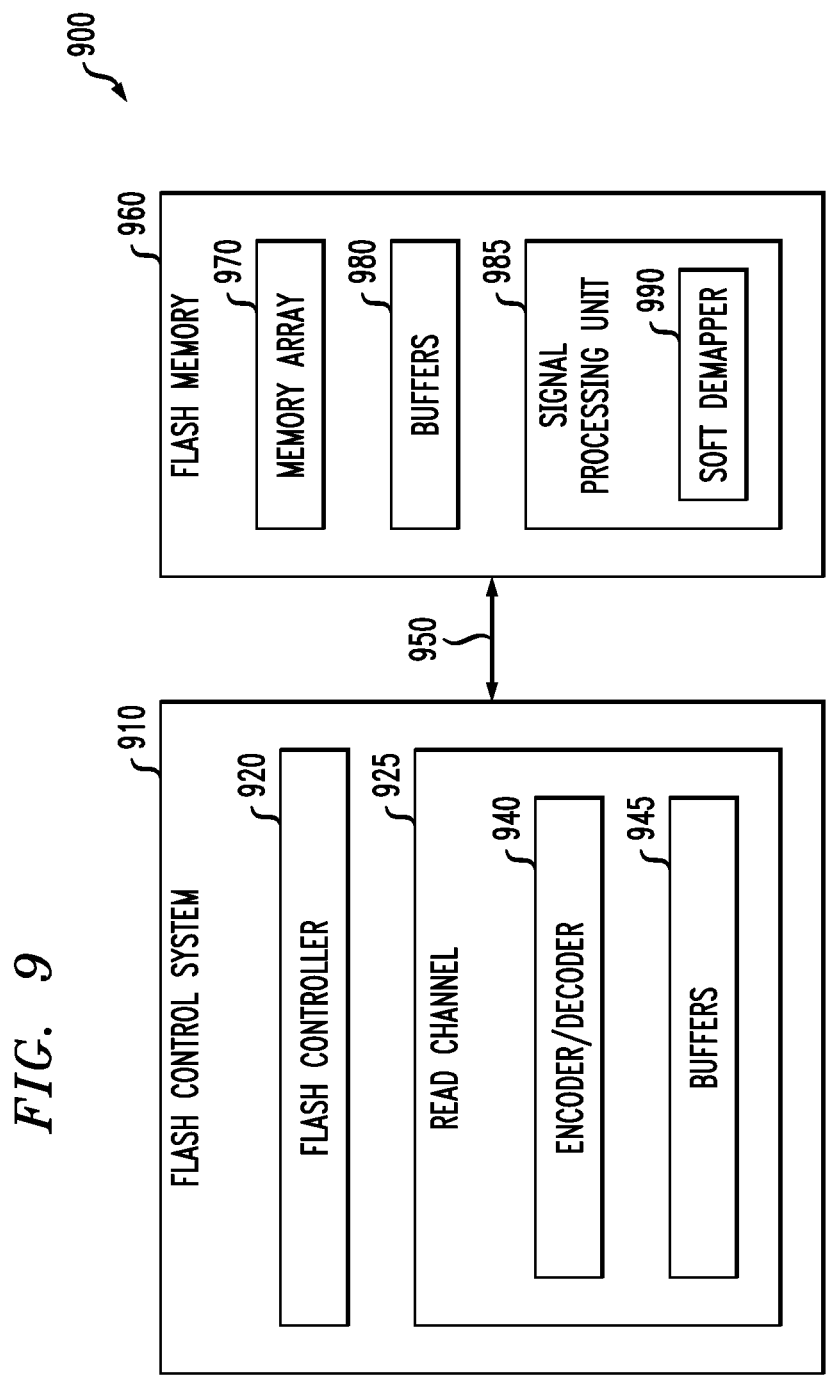
FIG. 9 is a schematic block diagram of an exemplary flash memory system incorporating memory-based ICI mitigation techniques in accordance with an alternate embodiment of the present invention.

FIG. 9 is a schematic block diagram of an exemplary flash memory system 900 incorporating memory-based soft demapping techniques in accordance with an alternate embodiment of the present invention. In a further embodiment, flash memory system 900 incorporates joint demapping and ICI mitigation techniques. As shown in FIG. 9, the exemplary flash memory system 900 comprises a flash control system 910 and a flash memory block 960, connected by an interface 950.

The exemplary flash control system 910 comprises a flash controller 920 and an optional read channel 925, typically on one or more integrated circuits. In an alternative embodiment, the encoder decoder block 940 and some buffers 945 may be implemented inside the flash controller 920. The exemplary flash controller 920 may be implemented, for example, using well-known commercially available techniques and/or products, as modified herein to support the features and functions of the present invention. The exemplary read channel 925 comprises an encoder/decoder block 940 and one or more buffers 945. The encoder/decoder block 940 and buffers 945 may be implemented using well-known commercially available techniques and/or products.

The exemplary flash memory block 960 comprises a memory array 970 and one or more buffers 980 that may each be implemented using well-known commercially available techniques and/or products. In addition, the exemplary flash memory block 960 comprises an exemplary signal processing unit 985 that comprises one or more processors that implement one or more soft demapping or joint demapping and ICI mitigation processes 990, discussed further below in conjunction with, for example, FIGS. 11-13.

In various embodiments of the disclosed ICI mitigation techniques, the exemplary interface 950 may need to convey additional information relative to a conventional flash memory system, such as values representing information associated with aggressor cells. Thus, the interface 950 may need to have a higher capacity or faster rate than an interface in conventional flash memory systems. The interface 950 may optionally be implemented, for example, in accordance with the teachings of International PCT Patent Application Serial No. PCT/US09/49328, entitled "Methods and Apparatus for Interfacing Between a Flash Memory Controller and a Flash Memory Array", filed contemporaneously herewith and incorporated by reference herein, which increases the information-carrying capacity of the interface 950 using, for example, Double Data Rate (DDR) techniques.

During a write operation, the interface 950 transfers the program data to be stored in the target and aggressor cells. During a read operation, the interface 950 transfers the new hard or soft read value or data that was computed by the joint demapping and ICI mitigation processes 990 for the target cell(s) and optionally the aggressor cells. Typically, the information conveyed for a single read access is a page or wordline of data. It is noted that only sending data for the target cells reduces the bandwidth requirements of the interface 950, at the expense of implementing the ICI mitigation processes inside the memory using the memory process technology used to manufacture the flash memory, which is typically optimized for memory and not logic circuits.

It is noted that the capacitive coupling coefficients, $k_x$, $k_y$, and $k_{xy}$, employed in the various embodiments of the ICI mitigation techniques of FIGS. 8 and 9 can be computed in the flash control system 810, 910 and/or the flash memory block 860, 960. It may be necessary for the capacitive coupling coefficients, $k_x$, $k_y$, and $k_{xy}$, to be transferred on the respective interface 850, 950. It is noted that the capacitive coupling coefficients may be adaptive and updated on a continuous, occasional or periodic basis.

Soft Demapper

Figure 10:
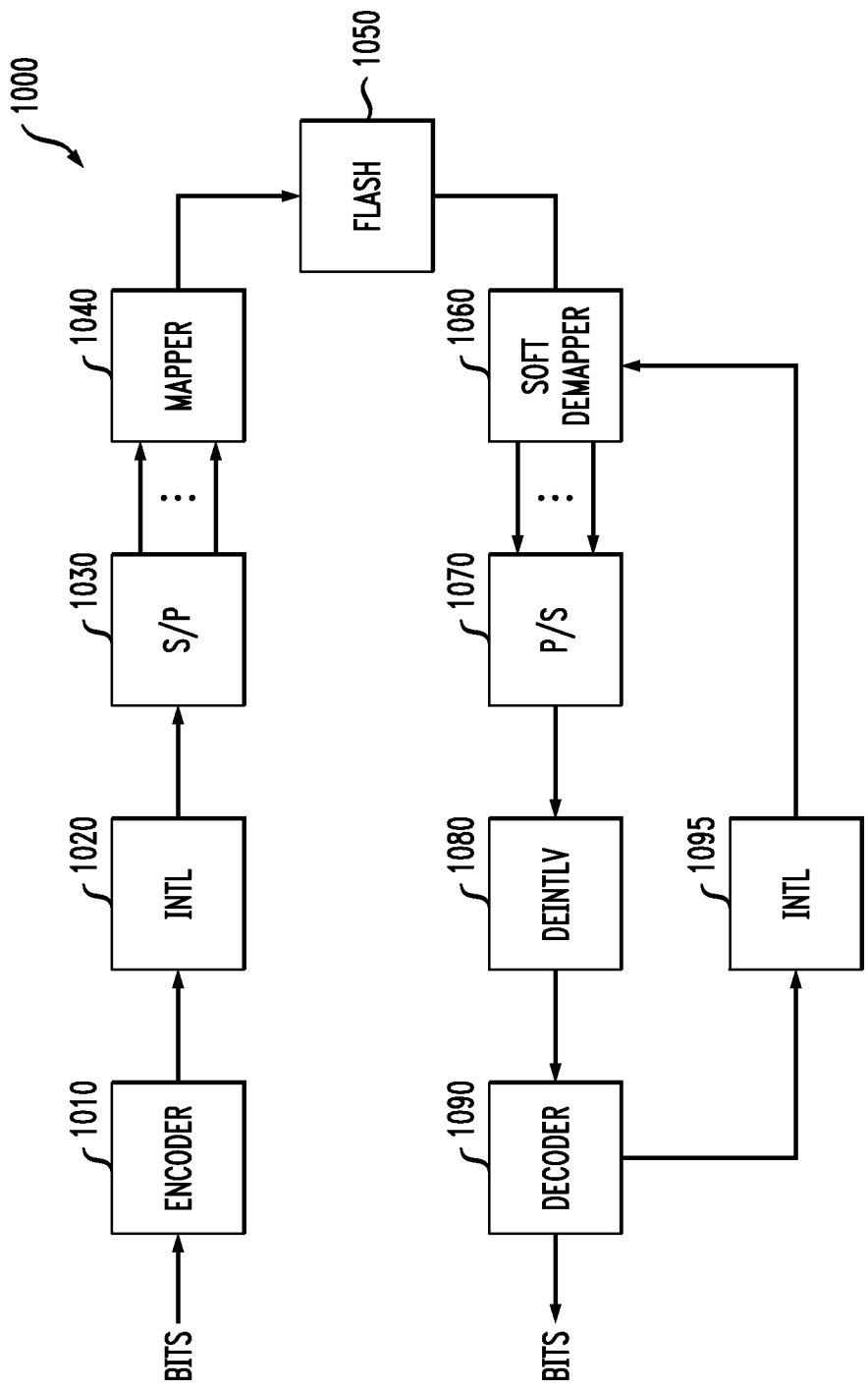
FIG. 10 illustrates an exemplary flash read channel architecture with iterative demapping and decoding in accordance with the present invention and optional interleaving.

FIG. 10 illustrates an exemplary flash read channel architecture 1000 with iterative demapping and decoding in accordance with the present invention and optional interleaving. As shown in FIG. 10, the exemplary write path comprises an encoder 1010, an optional interleaver 1020, a serial-to-parallel converter 1030 and a mapper 1040. Data is written to and read from the memory 1050, in a known manner. The exemplary read path comprises a soft demapper 1060, a parallel-to-serial converter 1070, a deinterleaver 1080, a decoder 1090 and an interleaver 1095. Generally, as discussed further below, the soft demapper 1060 generates soft information that is processed by the decoder 1090 to generate new soft information and fed back to the soft demapper in an iterative manner, until the iterative process converges to a final decision.

In one exemplary embodiment, the soft demapper 1060 generates soft information (LLRs) with the following equation:

$$L_e(C_t) = \log \frac{\sum_{s \in \chi_0^t} p(r \mid s) \cdot \prod_{q=1, q \neq t}^{m} \exp(-L_a(C_q) \cdot c_q)}{\sum_{s \in \chi_1^t} p(r \mid s) \cdot \prod_{q=1, q \neq t}^{m} \exp(-L_a(C_q) \cdot c_q)} \quad (2)$$

where p(r|s) are the probability density functions characterizing the flash channel; r is the measured read value (with arbitrary precision), typically representing the measured threshold voltage, s is the data or voltage level or voltage state (there are, for example, four voltage levels in two bits/cell MLC NAND flash), $c_q$ is the coded bit at position q, m is the number of bits per cell, $$L_a(C_t) = \log \frac{P(C_t = 0)}{P(C_t = 1)}$$

is the a priori log likelihood ratio for bit $C_t$ at position t, $L_a(C_q)$ is the log likelihood ratio for encoded bit $C_q$, $L_e(C_t)$ is the extrinsic log likelihood ratio for bit $C_t$, and $c_{c_t}^t$ is the subset of symbols whose bit labels have the value $C_t = c_t$ on position t. The a priori log likelihood ratio $L_a(C_t)$ is generated in an exemplary embodiment by a decoder, such a low-density parity check decoder, and might have optionally passed through an interleaver. The computed extrinsic log-likelihood ratio $L_e(C_t)$ can be provided in an exemplary embodiment to a decoder, such as a low-density parity check decoder or passed to a deinterleaver before decoding. The computed extrinsic log-likelihood ratio $L_e(C_t)$ can also be used to make a final decision on the read value.

Generally, in accordance with equation (2), for each possible binary value the probability of measuring a read value, r, for a given data level, s, is aggregated (e.g., summed or multiplied), for all data levels associated with the possible binary values. A ratio is then formed based on the aggregated probabilities for each of the possible binary values. The aggregated probabilities for each of the possible binary values are multiplied by an expression based on one or more a priori probability values for all the bits within a cell other than the bit for which the extrinsic log likelihood ratio is being computed.

As shown in FIG. 10, the soft information generated by the demapper 1060 can be used for iterative demapping and decoding between the soft demapper 1060, deinterleaver 1080, decoder 1090, and an interleaver 1095 in the feedback path.

In a further variation, the demapper 1060 can employ a Gaussian approximation of the probability density functions as follows:

$$L_e(C_t) \approx \max_{s \in \chi_0^t} \left[ -\frac{1}{2\sigma^2}(r-s)^2 - \sum_{q=1, q \neq t}^{m} L_a(C_q) \cdot c_q \right] - \max_{s \in \chi_1^t} \left[ -\frac{1}{2\sigma^2}(r-s)^2 - \sum_{q=1, q \neq t}^{m} L_a(C_q) \cdot c_q \right] \quad (2a)$$

where $\sigma^2$ is the variance of the probability density function for the threshold voltages, (computed for example as the second moment of the Gaussian pdf) and $L_a(C_q)$ is the log likelihood ratio for encoded bit $C_q$. For a discussion of the other terms in this equation, see the discussion of equation (2).

Figure 11:
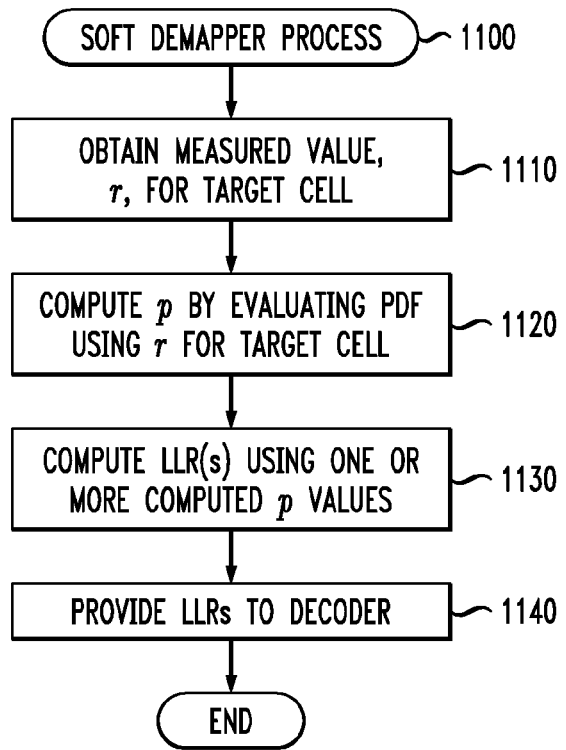
FIG. 11 is a flow chart describing an exemplary demapping process 1100 incorporating features of the present invention.

FIG. 11 is a flow chart describing an exemplary demapping process 1100 incorporating features of the present invention. As shown in FIG. 11, the exemplary demapping process 1100 initially obtains the measured value, r, for the target cell 710 during step 1110. Thereafter, p is obtained during step 1120 by evaluating the probability density function or an approximation thereof using the measured value of r for the target cell 710.

The LLRs are computed during step 1130 using equation (2) or (2a) (above) or an approximation thereof using the p values obtained from the probability density function during step 1120. Finally, during step 1140, the computed LLRs are provided to the decoder or optionally to a deinterleaver. In an alternative embodiment, the computed LLRs are used to make a final decision on the read data, for example, based on the sign of the LLRs.

Joint Demapping and Intercell Interference Mitigation

Figure 12:
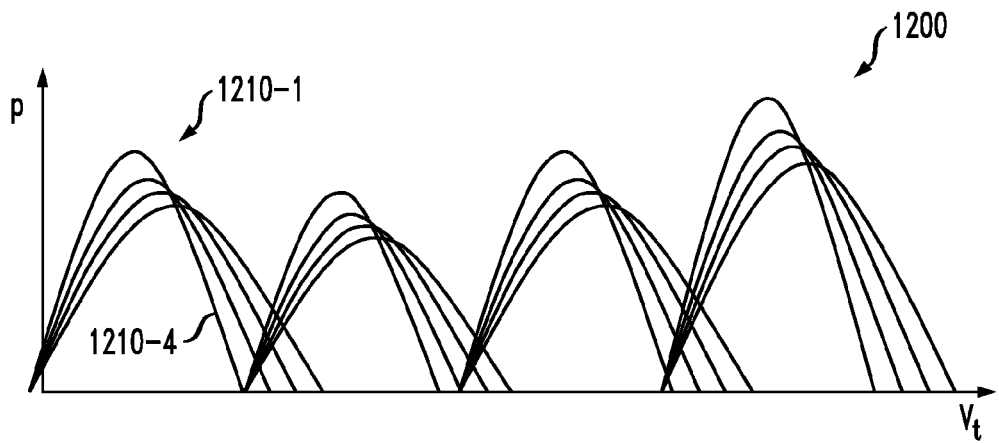
FIG. 12 illustrates a collection of probability density functions that indicate the possible ICI effect on a given target cell, based on all the possible values of each aggressor cell.

As previously indicated, one aspect of the present invention provides a joint demapping and ICI mitigation solution. The disclosed joint demapping and ICI mitigation solution considers the probability density functions (pdfs) conditioned on data patterns of surrounding cells. FIG. 12 illustrates an exemplary collection 1200 of probability density functions 1210 for a given target cell 710 of an exemplary multi-level cell flash memory 600. The exemplary multi-level cell flash memory 600 has four levels per cell (two bits), and one aggressor cell 720 is considered for the data-dependent pdfs.

FIG. 12 illustrates a collection 1200 of probability density functions that indicate the possible ICI effect on a given target cell 710, based on all the possible values of each aggressor cell 720. Thus, the number of probability density functions applicable to each possible level of a given target cell 710 is the number of possible levels for each aggressor cell 720 raised to the number of aggressor cells 720 that affect a given target cell 710. As previously indicated, in the exemplary embodiment, each cell can have one of four possible values, there is one aggressor cell 720 per target cell 710 and each aggressor cell 720 can have one of four possible levels. Thus, for illustration, the collection 1200 of probability density functions comprises four probability density functions 1210-1 through 1210-4 for data or voltage level 0, attributable to a pattern of the aggressor cells. There are also four probability density functions for each of the other data levels 1, 2 and 3. The present invention can be extended to multi-level cell flash memories 600 having an arbitrary number of levels per cell, and an arbitrary number of aggressor cells 720, as would be apparent to a person of ordinary skill in the art.

Generally, each probability density function in FIG. 12 expresses, among other noise and disturbance effects, the ICI effect on a given target cell 710 for a given value of a corresponding aggressor cell 720. In a further embodiment of the invention, the data-dependent probability density functions can expresses other data-dependent distortion instead of ICI or in addition to ICI. As discussed hereinafter, in various embodiments, the probability density functions can be predefined and static, adapted based on real-time observations, or expressed as a function of the measured or detected value, h, for the aggressor cell 720, such as a Gaussian function.

Figure 13:
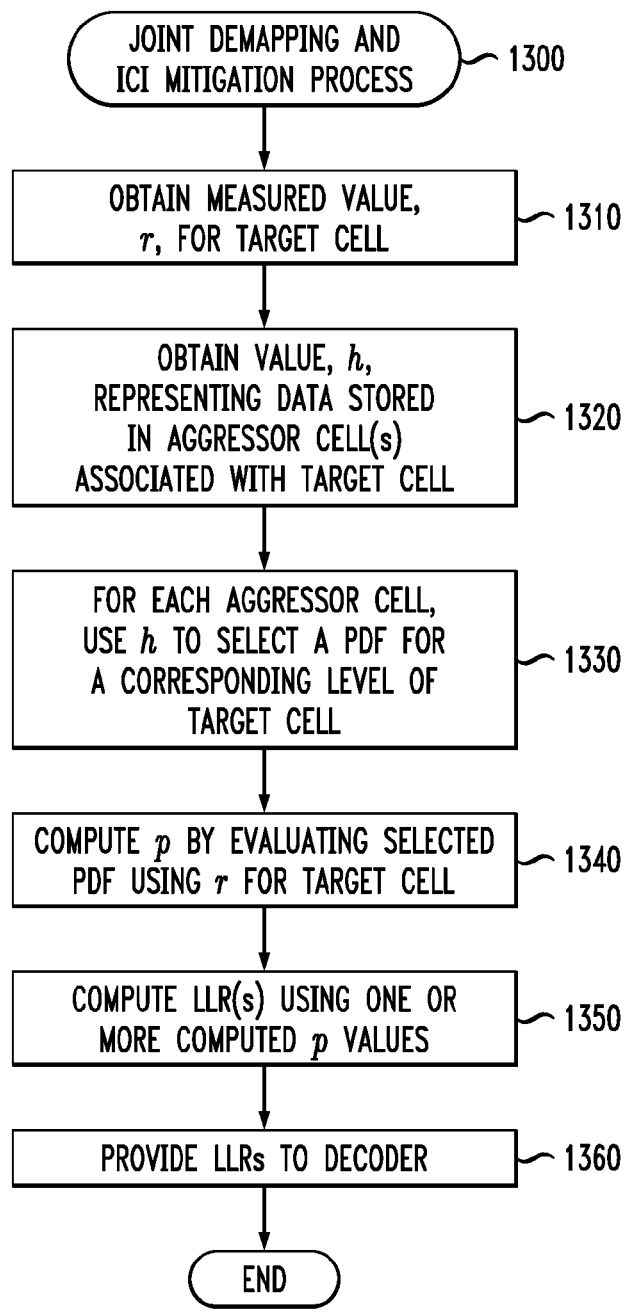
FIG. 13 is a flow chart describing an exemplary joint demapping and ICI mitigation process incorporating features of the present invention.

FIG. 13 is a flow chart describing an exemplary joint demapping and ICI mitigation process 1300 incorporating features of the present invention. As shown in FIG. 13, the exemplary joint demapping and ICI mitigation process 1300 initially obtains the measured value, r, for the target cell 710 during step 1310. Thereafter, the value, h, is obtained representing data stored in at least one the aggressor cell(s) 720 associated with the target cell 710 during step 1320. The values, h, may be hard decision and/or soft values or detected data.

For each aggressor cell, h is used during step 1330 to select the probability density function for a corresponding level of the target cell 710. A probability density function can optionally be selected for one or more possible levels of the target cell 710. The probability density function may be obtained, for example, from a table stored in memory or evaluated using a function that describes the probability density function. Thereafter, p is obtained during step 1340 from each probability density function obtained during step 1330 using the measured value of r for the target cell 710.

The LLRs are computed during step 1350 using equation (3) (below), using the p values obtained from each probability density function during step 1340. Finally, during step 1360, the computed LLRs are provided to the decoder, and optional deinterleaver or used to make a final decision on the read data.

In one exemplary embodiment, the joint demapping and ICI mitigation process 1300 implements the following cell pattern dependent probability density functions:

$$L_e(C_t) = \log \frac{\sum_{s \in \chi_0^t} p(r \mid s, h^{(i\pm1,j)}, h^{(i,j\pm1)}, h^{(i\pm1,j\pm1)}) \cdot \prod_{q=1, q\neq t}^{m} \exp(-L_a(C_q) \cdot c_q)}{\sum_{s \in \chi_1^t} p(r \mid s, h^{(i\pm1,j)}, h^{(i,j\pm1)}, h^{(i\pm1,j\pm1)}) \cdot \prod_{r=1, q\neq t}^{m} \exp(-L_a(C_q) \cdot c_q)} \quad (3)$$

where $h^{(i,j)}$ are voltage levels of the aggressor cells 720, based on the hard or soft output of the channel and $L_a(C_q)$ is the log likelihood ratio for encoded bit $C_q$.

According to another aspect of the invention, disturbance in a flash memory device can be characterized by obtaining one or more probability density functions that express pattern-dependent disturbance of one or more aggressor cells on at least one target cell; and selecting one or more of the probability density functions based on a pattern of values stored in at least a portion of the flash memory. The disturbance may comprise, for example, back pattern dependency, intercell interference, program disturb, read disturb and/or additional noise. The probability density function can be updated based on one or more data decisions. The probability density function can be represented as a stored table and/or an expression.

It is further noted that the table entries or function parameters of the probability density functions may optionally be adaptively updated, e.g., based on received data decisions. For example, as indicated above, a probability density function is selected based on a received aggressor pattern, h. The selected probability density function is then updated (e.g., by increasing a corresponding counter) with the latest occurrence, based on the received target cell value, r, using known techniques.

As previously indicated, the number of aggressor cells 720 that influence a given target cell 710 can be reduced or neglected based on a number of factors. In this manner, the number of probability density functions that need to be considered can be reduced. For example, if the diagonal coupling coefficients, $k_{xy}$, are much smaller than other coupling coefficients (as is often the case), the ICI from the diagonally positioned cells can be neglected. In addition, the programming sequence influences the number of aggressor cells 720 that need to be considered. For example, if wordlines are always written in a fixed order, such as a bottom up approach, then there is no ICI contribution from cells in a lower wordline. In addition, if the ICI is symmetric with respect to left and right neighbors of a target cell 710, the number of probability density functions that need to be characterized is reduced by half.

As previously indicated, in one exemplary implementation, the joint demapping and ICI mitigation solution assumes that the probability density functions can be approximated using Gaussian probability density functions.

In further variations, improved performance can be obtained at the expense of additional complexity, if the probability density functions are based on, for example, histograms. When the probability density functions are implemented using histograms, the probability density functions can be adaptively updated using successfully decoded wordlines to train the histograms.

In a further embodiment, the probability density functions and approximation thereof can be used by trellis-based detection algorithms, such as Viterbi, Soft Output Viterbi (SOVA) and BCJR algorithms to detect the read data as described below.

In a Viterbi implementation, cells are de-mapped in succession and the hard output for a currently de-mapped cell is based on previously de-mapped levels. A Viterbi implementation requires soft information from the flash channel and connections between demapper nodes, as would be apparent to a person of ordinary skill in the art. In an implementation based on Viterbi, Soft Output Viterbi (SOVA) or BCJR algorithms, the branch metrics are given by the probability density functions, $p(r|s, h^{(i\pm1,j)}, h^{(i,j\pm1)}, h^{(i\pm1,j\pm1)})$.

It is noted in a Viterbi implementation, that the trellis direction is configured opposite to the programming schedule, i.e., the cells that are programmed later are earlier in the trellis (since programming of new (neighboring) cells influences previously programmed cells). The definitions of SOVA and BCJR algorithms are similar. Branch metrics are computed based on the pattern-dependent probability density functions $p(r|s, h^{(i\pm1,j)}, h^{(i,j\pm1)}, h^{(i\pm1,j\pm1)})$ or approximations thereof. One difference from standard trellis-based algorithms is that in the case of flash memories, the trellis is two dimensional, reflecting the fact that ICI comes from neighboring bit lines and world lines.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal to processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for reading a target cell in a flash memory device capable of storing at least two data levels, s, per cell, said method comprising:
    obtaining a measured read value, r, for at least one target cell in said flash memory;
    evaluating at least one probability density function based on said measured read value, r, wherein said probability density function indicates a probability of measuring a read value, r, for a given data level, s; and
    computing one or more log likelihood ratios based on a result of said evaluating step; wherein said computing step further comprises the step of:
    aggregating for each of two possible binary values said probability of measuring a read value, r, for a given data level, s, for multiple data levels associated with said two possible binary values.

2. The method of claim 1, wherein said probability density function further comprises an expression of disturbance on said target cell.

3. The method of claim 1, wherein said probability density function further comprises an expression of pattern-dependent disturbance of one or more aggressor cells on at least one target cell in said flash memory.

4. The method of claim 1, further comprising the step of forming a ratio based on said aggregated probabilities for each of said two possible binary values.

5. The method of claim 1, further comprising the step of multiplying said aggregated probabilities for each of said two possible binary values by an expression based on one or more a priori probability values for all bits within a cell other than a bit for which said log likelihood ratio is being computed.

6. The method of claim 1, where said aggregating comprises one or more of a sum and a multiplication.

7. The method of claim 1, wherein said computing step evaluates the following expression:

$$L_e(C_t) = \log \frac{\sum_{s \in \chi_0^t} p(r|s) \cdot \prod_{q=1, q \neq t}^{m} \exp(-L_a(C_q) \cdot c_q)}{\sum_{s \in \chi_1^t} p(r|s) \cdot \prod_{r=1, q \neq t}^{m} \exp(-L_a(C_q) \cdot c_q)} \quad (2)$$

where p(r|s) are the probability density functions characterizing the flash memory; $c_q$ is the coded bit, m is the number of bits per cell, $L_a(C_t)$ is the log likelihood ratio, $L_a(C_q)$ is the log likelihood ratio for encoded bit $C_q$, $L_e(C_t)$ is extrinsic log likelihood ratio, and $\chi_{c_n}^t$ is a subset of symbols whose bit labels have the value $C_t = c_t$ on position t.

8. The method of claim 1, wherein said disturbance comprises one or more of back pattern dependency, intercell interference, program disturb, read disturb and additional noise.

9. The method of claim 1, wherein said probability density function is represented as one or more of a stored table and an expression.

10. A method for reading a target cell in a flash memory device capable of storing at least two data levels, s, per cell, said method comprising:
    obtaining a measured read value, r, for at least one target cell in said flash memory;
    obtaining a value, h, representing data stored for at least one aggressor cell in said flash memory;
    selecting one or more probability density functions based on a pattern of values stored in at least a portion of said flash memory, wherein said probability density functions comprises pattern-dependent disturbance of one or more aggressor cells on said at least one target cell in said flash memory;
    evaluating at least one selected probability density function based on said measured read value, r; and
    computing one or more log likelihood ratios based on a result of said evaluating step.

11. The method of claim 10, wherein said value, h, is one or more of a hard decision and a soft value.

12. The method of claim 10, wherein said computing step further comprises the step of aggregating for each of two possible binary values said probability of measuring a read value, r, for a given data level, s, for all data levels associated with said two possible binary values.

13. The method of claim 12, further comprising the step of forming a ratio based on said aggregated probabilities for each of said two possible binary values.

14. The method of claim 12, further comprising the step of multiplying said aggregated probabilities for each of said two possible binary values by an expression based on one or more a priori probability values for all bits within a cell other than a bit for which said log likelihood ratio is being computed.

15. The method of claim 12, where said aggregating comprises one or more of a sum and a multiplication.

16. The method of claim 12, wherein said evaluating step determines a pattern-dependent probability of measuring a read value, r, for a given data level, s, for a given pattern of values stored in said one or more aggressor cells.

17. The method of claim 10, wherein said computing step evaluates the following expression:

$$L_e(C_t) = \log \frac{\sum_{s \in \chi_0^t} p(r \mid s, h^{(i \pm 1, j)}, h^{(i, j \pm 1)}, h^{(i \pm 1, j \pm 1)}) \cdot \prod_{q=1, q \neq t}^{m} \exp(-L_a(C_q) \cdot c_q)}{\sum_{s \in \chi_1^t} p(r \mid s, h^{(i \pm 1, j)}, h^{(i, j \pm 1)}, h^{(i \pm 1, j \pm 1)}) \cdot \prod_{r=1, q \neq t}^{m} \exp(-L_a(C_q) \cdot c_q)} \quad (3)$$

where $h^{(i,j)}$ are voltage levels of the aggressor cells, based on the hard output of said flash memory, $p(r|s)$ are the probability density functions characterizing the flash memory; r is the received signal, s is the noiseless signal, $c_q$ is the coded bit, m is the number of bits per cell, $L_a(C_t)$ is the log likelihood ratio, $L_a(C_q)$ is the log likelihood ratio for encoded bit $C_q$, $L_e(C_t)$ is extrinsic log likelihood ratio, and $\chi_{c_t}^t$ is a subset of symbols whose bit labels have the value $C_t = c_t$ on position t.

18. The method of claim 10, wherein said probability density functions further comprise one or more of back pattern dependency, intercell interference, program disturb, read disturb and additional noise.

19. The method of claim 10, wherein said probability density function is represented as one or more of a stored table and an expression.

20. The method of claim 10, further comprising the step of performing multiple iterations using soft information.

21. The method of claim 10, wherein at least one of said one or more probability density functions comprises a histogram.

22. The method of claim 10, wherein at least one of said one or more probability density functions is expressed using a Gaussian approximation.

23. The method of claim 10, wherein at least one of said one or more probability density functions is based on a trellis-based algorithm.

24. A method for characterizing disturbance in a flash memory, comprising:
obtaining one or more probability density functions that express pattern-dependent disturbance of one or more aggressor cells on at least one target cell; and
selecting one or more of said probability density functions based on a pattern of values stored in at least a portion of said flash memory.

25. The method of claim 24, wherein said disturbance comprises one or more of back pattern dependency, intercell interference, program disturb, read disturb and additional noise.

26. The method of claim 24, wherein said probability density function is represented as one or more of a stored table and an expression.

27. The method of claim 24, further comprising the step of updating said probability density function based on one or more data decisions.

28. A system for reading a target cell in a flash memory device capable of storing at least two data levels, s, per cell, comprising:
a memory; and
at least one processor, coupled to the memory, operative to:
obtain a measured read value, r, for at least one target cell in said flash memory;
evaluate at least one probability density function based on said measured read value, r, wherein said probability density function indicates a probability of measuring a read value, r, for a given data level, s; and
compute one or more log likelihood ratios based on a result of said evaluation; wherein said computation comprises aggregating for each of two possible binary values said probability of measuring a read value, r, for a given data level, s, for multiple data levels associated with said two possible binary values.

29. The system of claim 28, wherein said at least one hardware device is further configured to form a ratio based on said aggregated probabilities for each of said two possible binary values.

30. The system of claim 28, wherein said at least one hardware device is further configured to multiply said aggregated probabilities for each of said two possible binary values by an expression based on one or more a priori probability values for all bits within a cell other than a bit for which said log likelihood ratio is being computed.

31. The system of claim 28, wherein said aggregating comprises one or more of a sum and a multiplication.

32. The system of claim 28, wherein said computation of one or more log likelihood ratios evaluates the following expression:

$$L_e(C_t) = \log \frac{\sum_{s \in \chi_0^t} p(r \mid s) \cdot \prod_{q=1, q \neq t}^{m} \exp(-L_a(C_q) \cdot c_q)}{\sum_{s \in \chi_1^t} p(r \mid s) \cdot \prod_{r=1, q \neq t}^{m} \exp(-L_a(C_q) \cdot c_q)} \quad (2)$$

where $p(r|s)$ are the probability density functions characterizing the flash memory; $c_q$ is the coded bit, m is the number of bits per cell, $L_a(C_t)$ is the log likelihood ratio, $L_a(C_q)$ is the log likelihood ratio for encoded bit $C_q$, $L_e(C_t)$ is extrinsic log likelihood ratio, and $\chi_{c_t}^t$ is a subset of symbols whose bit labels have the value $C_t = c_t$ on position t.

33. A system for reading a target cell in a flash memory device capable of storing at least two data levels, s, per cell, comprising:
a memory; and
at least one processor, coupled to the memory, operative to:
obtain a measured read value, r, for at least one target cell in said flash memory;
obtain a value, h, representing data stored for at least one aggressor cell in said flash memory;
select one or more probability density functions based on a pattern of values stored in at least a portion of said flash memory, wherein said probability density functions comprises pattern-dependent disturbance of one or more aggressor cells on said at least one target cell in said flash memory;
evaluate at least one selected probability density function based on said measured read value, r; and
compute one or more log likelihood ratios based on a result of said evaluation.

\* \* \* \* \*